United States Patent
Betiuk et al.

(10) Patent No.: US 11,946,652 B2
(45) Date of Patent: Apr. 2, 2024

(54) CONTROL CIRCUIT FOR AN ELECTROMAGNETIC VALVE, GAS BURNING SYSTEM, METHOD FOR MONITORING A SWITCHING STATE OF AN ELECTROMAGNETIC VALVE AND METHOD FOR OPERATING A GAS BURNING SYSTEM

(71) Applicant: Diehl AKO Stiftung & Co. KG, Wangen (DE)

(72) Inventors: Jakub Betiuk, Lowicz (PL); Michal Siesicki, Wroclaw (PL)

(73) Assignee: Diehl AKO Stiftung & Co. KG, Wangen (DE)

( * ) Notice: Subject to any disclaimer, the term of this patent is extended or adjusted under 35 U.S.C. 154(b) by 490 days.

(21) Appl. No.: 17/148,739

(22) Filed: Jan. 14, 2021

(65) Prior Publication Data

US 2021/0215341 A1 Jul. 15, 2021

(30) Foreign Application Priority Data

Jan. 14, 2020 (DE) ...................... 10 2020 000 164.5
Sep. 30, 2020 (DE) ...................... 10 2020 125 488.1

(51) Int. Cl.
*F24C 3/12* (2006.01)
*F16K 37/00* (2006.01)
(Continued)

(52) U.S. Cl.
CPC ............ *F24C 3/12* (2013.01); *F16K 37/0041* (2013.01); *F16K 37/0083* (2013.01);
(Continued)

(58) Field of Classification Search
CPC .............. H01H 47/002; G01R 31/3278; F16K 37/0041; F16K 37/0083; F24C 3/12;
(Continued)

(56) References Cited

U.S. PATENT DOCUMENTS

2019/0057827 A1* 2/2019 Khan ................. G01R 31/3278
2021/0231305 A1* 7/2021 Lovison .................. F23N 5/107
(Continued)

FOREIGN PATENT DOCUMENTS

ES          2737523 A1 *  1/2020  ........... F16K 31/002

*Primary Examiner* — Atif H Chaudry
(74) *Attorney, Agent, or Firm* — Laurence A. Greenberg; Werner H. Stemer; Ralph E. Locher

(57) ABSTRACT

An electromagnetic valve has a magnetic coil and a movable element coupled to a valve element. The magnetic coil, when excited, conveys the movable element in one direction to move the valve element from its initial position into its active position. A control circuit for the electromagnetic valve has a current source for optionally supplying current to the magnetic coil and a measuring device for measuring a voltage level of the magnetic coil and/or a current level through the magnetic coil. A monitoring unit which is connected to the measuring device establishes a switching state of the electromagnetic valve corresponding to the position of its valve element based on the intended current supply state of the current source and the current and/or voltage characteristic measured by the measuring device and, if appropriate, determines a fault state of the current supply and/or the electromagnetic valve.

11 Claims, 3 Drawing Sheets

(51) Int. Cl.
*F23N 1/00* (2006.01)
*F23N 5/10* (2006.01)
*F23N 5/24* (2006.01)
*G01R 31/327* (2006.01)
*H01H 47/00* (2006.01)

(52) U.S. Cl.
CPC ............. *F23N 1/005* (2013.01); *F23N 5/102* (2013.01); *F23N 5/242* (2013.01); *G01R 31/3278* (2013.01); *H01H 47/002* (2013.01); *F23K 2400/201* (2020.05); *F23N 2223/30* (2020.01); *F23N 2225/16* (2020.01); *F23N 2231/10* (2020.01); *F23N 2235/22* (2020.01); *F23N 2900/05005* (2013.01)

(58) Field of Classification Search
CPC ...... F23N 1/005; F23N 1/002; F23N 2235/22; F23K 2400/201
See application file for complete search history.

(56) References Cited

U.S. PATENT DOCUMENTS

| | | | |
|---|---|---|---|
| 2023/0201033 A1* | 6/2023 | Agahi | G05D 7/0635 606/107 |
| 2023/0329220 A1* | 10/2023 | Krosschell | B05B 1/083 |

* cited by examiner

CONTROL CIRCUIT FOR AN ELECTROMAGNETIC VALVE, GAS BURNING SYSTEM, METHOD FOR MONITORING A SWITCHING STATE OF AN ELECTROMAGNETIC VALVE AND METHOD FOR OPERATING A GAS BURNING SYSTEM

CROSS-REFERENCE TO RELATED APPLICATION

This application claims the priority, under 35 U.S.C. § 119, of German Patent Application Nos. DE 10 2020 000 164.5, filed Jan. 14, 2020, and DE 10 2020 125 488.1, filed Sep. 30, 2020; the prior applications are herewith incorporated by reference in their entirety.

BACKGROUND OF THE INVENTION

Field of the Invention

The present invention relates to a control circuit for an electromagnetic valve, a gas burning system including an electromagnetic gas valve and the control circuit, a method for monitoring a switching state of an electromagnetic valve and a method for operating a gas burning system including an electromagnetic gas valve and monitoring the switching state of the gas valve.

Electromagnetic valves typically have a magnetic coil and a movable element coupled to a valve element, wherein the magnetic coil, when excited, conveys the movable element in one direction in order to move the valve element from its initial position into its active position. Depending on the application case of the electromagnetic valve, it is often necessary to monitor the switching state of the electromagnetic valve. For this purpose, the electromagnetic valves are generally provided with sensors or connected to external sensors, which establish the switching state of the electromagnetic valve, for example by detecting the position of the valve element or a fluid throughflow through the electromagnetic valve.

BRIEF SUMMARY OF THE INVENTION

It is accordingly an object of the invention to provide a control circuit for an electromagnetic valve, a gas burning system, a method for monitoring a switching state of an electromagnetic valve and a method for operating a gas burning system, which overcome the hereinafore-mentioned disadvantages of the heretofore-known control circuits, systems and methods of this general type and which provide improved measures for monitoring a switching state of an electromagnetic valve.

With the foregoing and other objects in view there is provided, in accordance with the invention, a control circuit for an electromagnetic valve having a magnetic coil and a movable element coupled to a valve element, the magnetic coil, when excited, conveying the movable element in one direction in order to move the valve element from its initial position into its active position, the control circuit including a current source for optionally supplying current to the magnetic coil of the electromagnetic valve, a measuring device for measuring a voltage level of the magnetic coil and/or a current level through the magnetic coil, and a monitoring unit connected to the measuring device, the monitoring unit configured to establish a switching state of the electromagnetic valve corresponding to the position of its valve element on the basis of an intended current supply state of the current source and the current and/or voltage characteristic measured by the measuring device.

That is to say that, in accordance with the invention, no additional sensors or other additional components are required for monitoring the switching state of the electromagnetic valve, but rather the monitoring is performed by the control circuit, which is provided in any case, with the measuring device, which is usually integrated in any case. As a result, the electromagnetic valve with its control circuit can be produced more easily and more cost-effectively, and the monitoring of the switching state of the electromagnetic valve can be performed more effectively and more easily.

The invention is based on the knowledge of the inventors that the magnetic coil of the electromagnetic valve firstly, when excited by current supply, generates an electromotive force (EMF), through the use of which the movable element is moved and thus the valve element connected to the movable element moves, and secondly experiences a current induction in the case of a movement of the movable element as a result of an electromotive return force (back-EMF). Therefore, a current induction can be detected by the measurement of the voltage level of the magnetic coil and/or the current level through the magnetic coil and, on the basis of this, a movement of the movable element and, as a result, a switching state of the electromagnetic valve can be inferred.

In this connection, the initial position of the valve element can be closed or open, depending on the application of the electromagnetic valve. Correspondingly, the active position of the valve element can be open or closed, depending on the application of the electromagnetic valve. The invention is not restricted to a specific structure of the electromagnetic valve or its components.

In addition, in this connection, the current source is, for example, an internal electric generator or current store or storage device of the control circuit or an electrical terminal of the control circuit for connection to an external electric generator or current store or circuit. The current supply state of the current source is then, for example, a switched-on/open or switched-off/closed current source or an open or blocked connection between the current source and the magnetic coil, depending on the embodiment of the current source.

In one configuration of the invention, the control circuit additionally has an output device, and the monitoring unit is configured to determine a fault state of the current supply and/or of the electromagnetic valve on the basis of the established switching state of the electromagnetic valve and to transmit a signal for outputting a fault message corresponding to the determined fault state to the output device. The output device for outputting the fault message can in this connection be, for example, a display and/or a loudspeaker on the electromagnetic valve or a device connected to the electromagnetic valve or a computer device (for example a smartphone of a user, a central control unit, etc.).

The monitoring unit of the control circuit is preferably configured to infer a movement of the movable element of the electromagnetic valve when a signal peak is detected by the measuring device (i.e. a peak in the voltage characteristic or current characteristic). In this way, the monitoring unit can infer an unintentionally failed current supply, for example, when a signal peak is detected by the measuring device during an intended continuing current supply to the magnetic coil or infer a failed movement of the valve element into its initial position when a signal peak is not detected by the measuring device after a disconnection of the current supply to the magnetic coil.

In one configuration of the invention, the measuring device can be connected to the monitoring unit through a signal amplifier. In this way, the evaluation of the measurement signals by the monitoring unit can be improved.

In one configuration of the invention, the control circuit can additionally have a control unit for actuating the current source, the connection between the current source and the magnetic coil of the electromagnetic valve and/or a safety device of the control circuit. The above-described monitoring unit of the control circuit is preferably connected to such a control unit or integrated in such a control unit.

The above-described control circuit of the invention can advantageously be used in a gas burning system. The subject matter of the invention therefore also resides in a gas burning system, which has a gas burner, to which burnable gas can be supplied through a gas supply line, and which has an ignition element for generating a gas flame; an electromagnetic gas valve for optionally opening or blocking the gas inflow through the gas supply line to the gas burner; and an above-described control circuit of the invention for actuating the electromagnetic gas valve.

In one configuration of the invention, the control circuit can have a thermocouple, which is positioned close to the gas burner and which generates electrical energy from heat due to a thermoelectric effect, as current source.

The invention proposes, in addition, a method for monitoring a switching state of an electromagnetic valve, which has a magnetic coil, to which current can optionally be supplied from a current source, and a movable element coupled to a valve element, wherein the magnetic coil, when excited, conveys the movable element in one direction in order to move the valve element from its initial position into its active position, which method includes the following steps: measuring a voltage level of the magnetic coil and/or a current level through the magnetic coil; and establishing a switching state of the electromagnetic valve corresponding to the position of its valve element on the basis of an intended current supply state of the current source and the measured current and/or voltage characteristic.

With this method, it is possible for the same advantages to be achieved as with the above-described control circuit of the invention. With respect to the advantages, the basic knowledge and the definitions of terms, reference is made in summary to the above explanations in connection with the control circuit of the invention.

In one configuration of the invention, the method also includes determining a fault state of the current supply and/or of the electromagnetic valve on the basis of the established switching state of the electromagnetic valve and transmitting a signal for outputting a fault message corresponding to the determined fault state to an output device.

Preferably, a movement of the movable element of the electromagnetic valve is inferred when a signal peak is detected (i.e. a peak in the voltage characteristic or current characteristic) in the measured current and/or voltage characteristic. In this way, for example, an unintentionally failed current supply is inferred when a signal peak is detected during an intended continuing current supply to the magnetic coil or a failed movement of the valve element into its initial position is inferred when a signal peak is not detected after a disconnection of the current supply to the magnetic coil.

The method according to the invention can advantageously also be used in a gas burning system. The subject matter of the invention therefore also resides in a method for operating a gas burning system, which has a gas burner, to which burnable gas can be supplied through a gas supply line, and which has an ignition element for generating a gas flame, and an electromagnetic gas valve for optionally opening or blocking the gas inflow through the gas supply line to the gas burner, in which a switching state of the electromagnetic gas valve is monitored by the above-described method of the invention.

Other features which are considered as characteristic for the invention are set forth in the appended claims.

Although the invention is illustrated and described herein as embodied in a control circuit for an electromagnetic valve, a gas burning system, a method for monitoring a switching state of an electromagnetic valve and a method for operating a gas burning system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
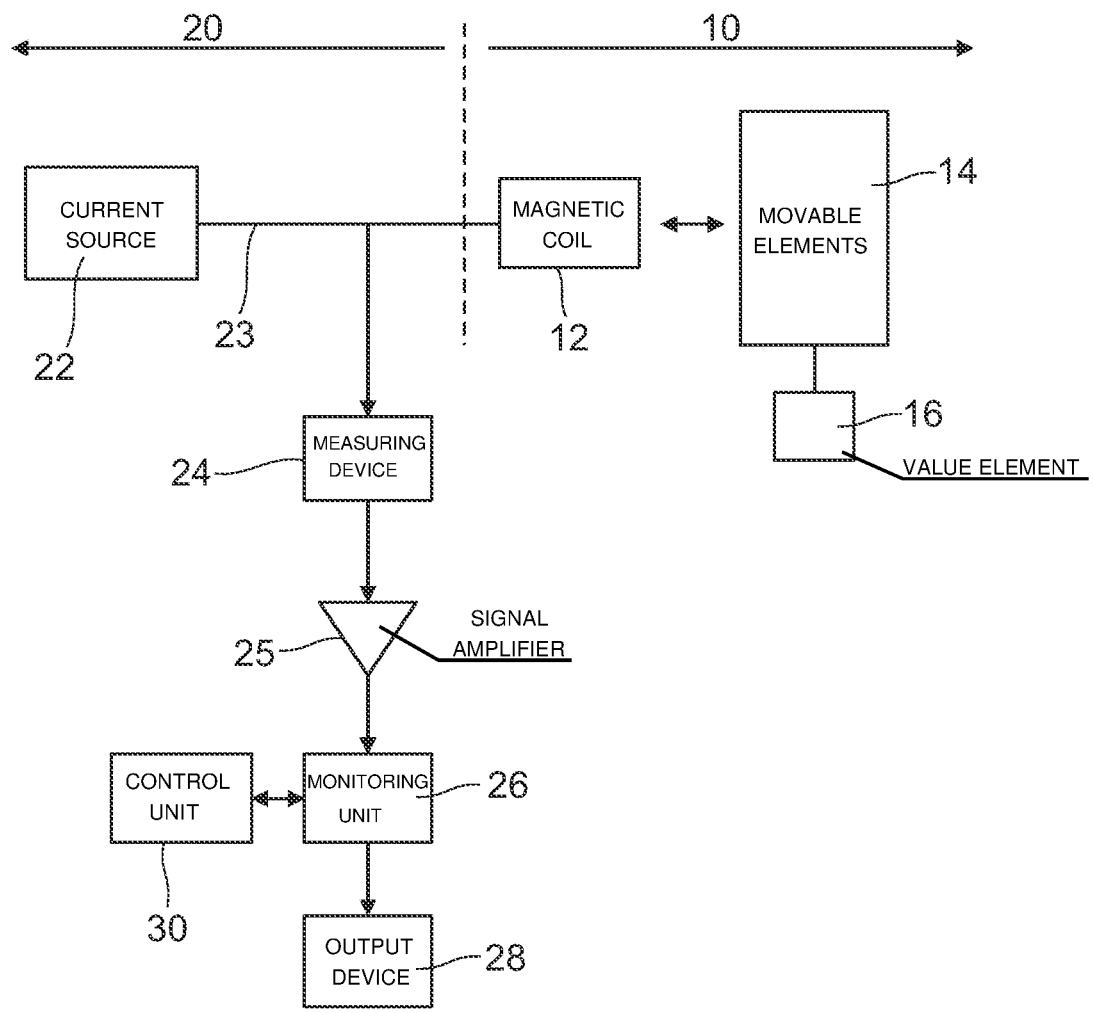
FIG. 1 is a block diagram showing a basic configuration of a control circuit for an electromagnetic valve in accordance with the present invention.

Referring now to the figures of the drawings in detail and first, particularly, to FIG. 1 thereof, there is seen an example of the basic concept of the invention.

An electromagnetic valve 10 contains a magnetic coil 12, a movable element 14 and a valve element 16. The valve element 16 is movable between an initial position and an active position in order to either open or block a fluid throughflow. The valve element 16 is connected to the movable element 14, with the result that a movement of the movable element 14 effects a movement of the valve element 16. The movable element 14 is, for example, a metallic or magnetic element, with the result that it is moved by the electromotive force (EMF) from the magnetic coil 12, to which current is supplied and which is thereby excited, directly or indirectly (for example through a fixed iron core). The movable element 14 is preferably biased in its initial position, with the result that the valve element 16 is also biased in its initial position.

The current supply to the magnetic coil 12 takes place by using a control circuit 20. The control circuit 20 contains a current source 22, which is connected to the magnetic coil 12 of the electromagnetic valve 10 through a connecting line 23. If the current source 22 is, for example, an electric generator, the current source can optionally be switched on and off in order to optionally supply the magnetic coil 12 with current. If the current source 22 is, for example, a current storage device or an electrical terminal connected to an external current source, the connection through the connecting line 23 to the magnetic coil 12 can optionally be opened or blocked in order to optionally supply the magnetic coil 12 with current.

In addition, the control circuit 20 has a measuring device 24, which is coupled to the connecting line 23 and is configured to measure a voltage level of the magnetic coil 12 and/or a current level through the magnetic coil. The measurement signals of the measuring device 24 are transmitted to a monitoring unit 26, preferably through a signal amplifier 25. The monitoring unit 26 is configured to evaluate the (amplified) measurement signals from the measuring device 24 and, on the basis thereof, to monitor a switching state of the electromagnetic valve 10. The monitored switching state of the electromagnetic valve 10 corresponds to the position of its valve element 16. On the basis of the switching state of the electromagnetic valve 10 thus established, the monitoring unit can then also determine an absence of faults or a fault state of the current supply and/or the electromagnetic valve.

The monitoring unit 26 is preferably connected to an output device 28, which is configured, for example, as a display and/or loudspeaker or as a smartphone. If the monitoring unit determines a fault state of the current supply and/or the electromagnetic valve, it sends a signal to the output device 28 in order that the output device outputs a fault message which corresponds to the established fault state.

As indicated in FIG. 1, the control circuit 20 can additionally contain a control unit 30. The monitoring unit 26 is preferably connected to the control unit 30 or integrated in the control unit 30. Depending on the specific embodiment of the current supply, the control unit 30 can actuate, for example, the current source 22 or actuate the connection between the current source 22 and the magnetic coil 12. In addition, the control unit 30 can, if required, initiate safety measures for the operation of the control circuit 20 and/or the electromagnetic valve 10.

Figure 2:
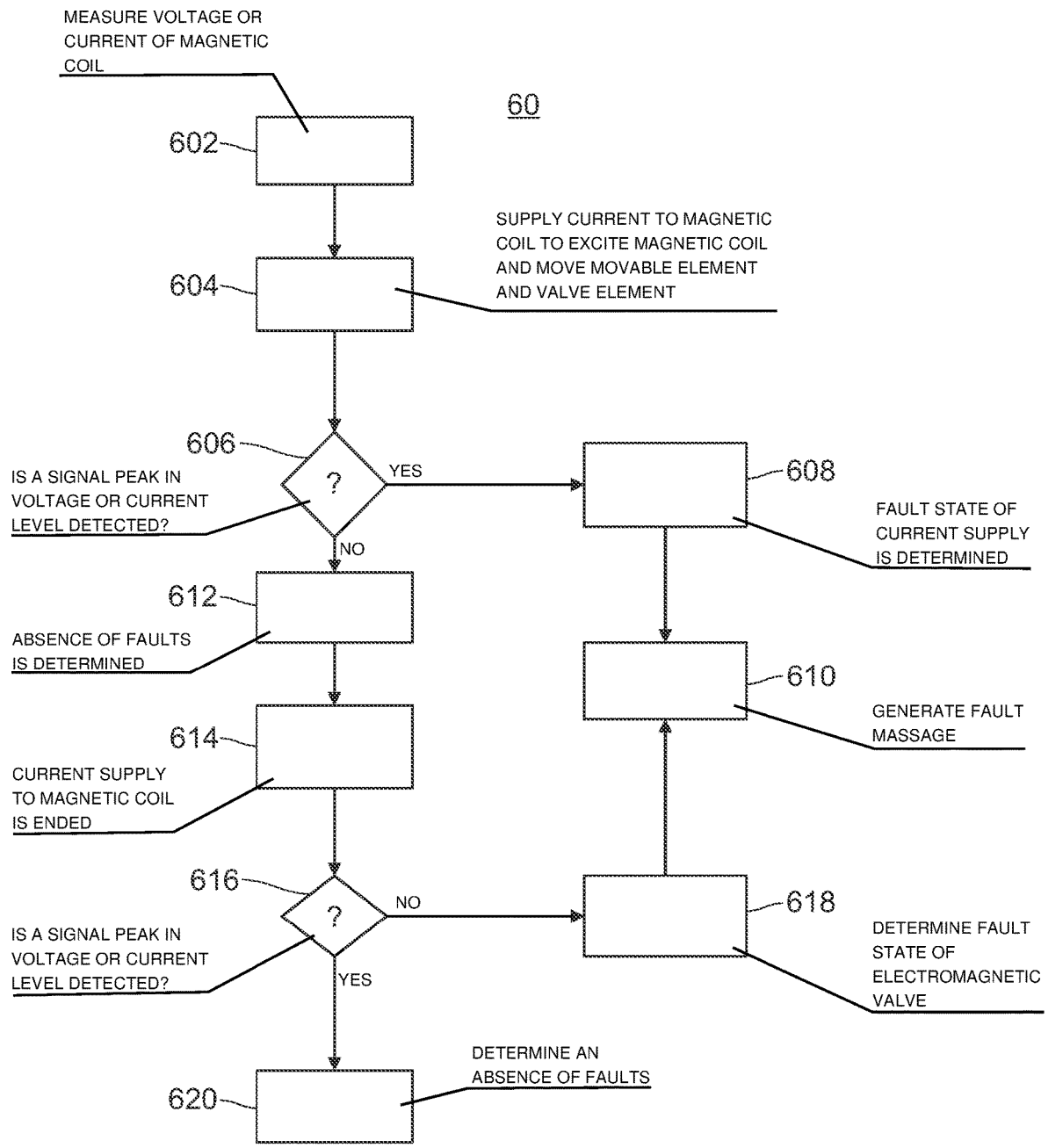
FIG. 2 is a block diagram showing a flowchart of a method for monitoring a switching state of an electromagnetic valve in accordance with one exemplary embodiment of the present invention.

The monitoring of the switching state of the electromagnetic valve 10 takes place by using the control circuit 20 which is present in any case by using the measuring device 24 which is generally present therein in any case. The mode of operation of the monitoring is explained in more detail now with reference to FIG. 2.

In a monitoring method 60, a measurement of the voltage level of the magnetic coil 12 or of the current level through the magnetic coil 12 is performed continuously by the measuring device 24 (step 602). In step 604, the current supply to the magnetic coil 12 by the current source 22 is started, for example by activating an electric generator. Due to the current supply to the magnetic coil 12, the magnetic coil is excited and, by using electromotive force, effects a movement of the movable element 14, with the result that the valve element 16 is moved into its active position. In the case of a continuous current supply, the magnetic coil 12 remains excited and holds the movable element 14 in its position, in which the valve element 16 is located in its active position.

In step 606, a check is performed to ascertain whether a signal peak in the voltage or current level is detected in the case of this intended continuing current supply by the measuring device 24. Such a voltage peak would be generated when the current supply fails and therefore the excitation of the magnetic coil 12 ends and the movable element 14 therefore moves back into its initial position due to the bias, which generates an induction in the magnetic coil 12 as a result of back-EMF.

If, in step 606, a signal peak in the voltage or current characteristic is identified by the monitoring unit 26, in step 608 a fault state of the current supply (unintentionally failed current supply) is determined. The monitoring unit 26 then generates, in step 610, a corresponding fault message, which is output by the output device 28.

If, in step 606, on the other hand, no signal peak in the voltage or current characteristic is identified, in step 612 an absence of faults is determined. The electromagnetic valve 10 then remains in its correct active switching state during continuing current supply to the magnetic coil 12. The checking to ascertain whether a signal peak is detected is continued permanently.

At a later time, in step 614, the current supply to the magnetic coil 12 by the current source 22 is ended, for example by deactivation of the electric generator. Due to the fact that there is no longer a current supply to the magnetic coil 12, the magnetic coil no longer generates any electromotive force, with the result that the movable element 14 and the valve element 16 are no longer forced into the active positions.

In step 616, a check is performed to ascertain whether a signal peak in the voltage or current level is detected once the current supply to the measuring device 24 has ended. Such a voltage peak would be generated when the movable element 14 moves back into its initial position and in the process induces a current flow through the magnetic coil 12 as a result of back-EMF.

If, in step 616, no signal peak in the voltage or current characteristic is identified by the monitoring unit 26, in step 618 a fault state of the electromagnetic valve 10 (valve element 16 remains in active position) is determined. The monitoring unit 26 then, in step 610, generates a corresponding fault message, which is output by the output device 28. If, in step 606, on the other hand, a signal peak in the voltage or current characteristic is identified, in step 620 an absence of faults is determined.

Figure 3:
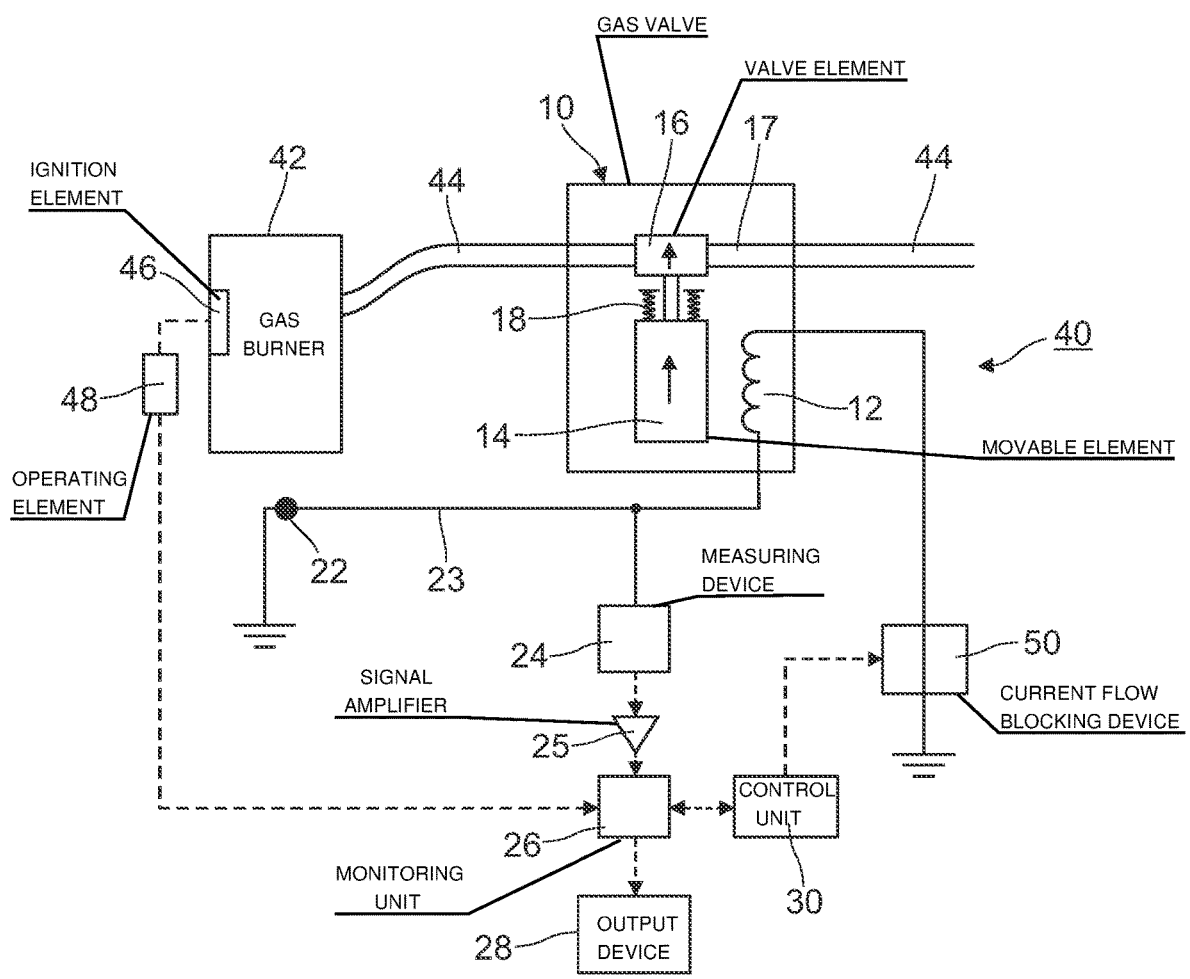
FIG. 3 is a block diagram showing a configuration of a gas burning system having a control circuit for the gas valve in accordance with one exemplary embodiment of the present invention.

With reference to FIG. 3, a specific application of the above-described control circuit 20 and the above-described monitoring method in a gas burning system will now be explained in more detail by way of example.

A gas burning system 40 has a gas burner 42, to which gas is supplied from a gas supply line 44 through a gas valve 10. The gas burner 42 contains an ignition element 46 for generating a gas flame and is equipped with or connected to an operating element 48 for optionally switching on and off the ignition element 46.

The gas valve 10 is configured as an electromagnetic valve and contains, similarly to FIG. 1, a magnetic coil 12, a movable element 14 and a valve element 16. In FIG. 3, a bias spring 18, which is also indicated, biases the movable element 14 in its initial position. In this application, the valve element 16 in its initial position blocks a passage 17 of the gas supply line 44 through the gas valve. In the case of a current supply to the magnetic coil 12, the magnetic coil is excited and moves the movable element 14, counter to the force of the bias spring 18, into its active position, with the result that the valve element 16 is also moved into its active position, in which it opens the passage 17 of the gas supply line 44. With continued current supply to the magnetic coil 12, the magnetic coil holds the movable element 14 and therefore also the valve element 16 in their active positions counter to the force of the bias spring 18.

The control circuit 20 in principle corresponds to the control circuit illustrated in FIG. 1. In the exemplary embodiment of FIG. 3, the control circuit 20 has a thermocouple as current source 22, which is disposed close to the gas burner 42. The thermocouple 22 generates an electrical energy in the case of heat being generated in the gas burner 42 due to a thermoelectric effect, with the result that the magnetic coil 12 of the gas valve 10 is supplied with current. The monitoring unit 26 is also connected to the operating element 48 of the gas burner 42 in order to ensure that it knows, when monitoring the switching state of the gas valve 10, whether the user has started or ended the operation of the gas burner 42.

In addition, the control circuit 20 has a current flow blocking device 50, which can be activated, if required (for example due to a malfunction in the gas burner 42), by the control unit 30 as a safety measure in order to block the current supply to the magnetic coil 12 in order to ensure that the gas valve 10 returns to its initial position in which it blocks the gas supply line 44.

This gas burning system operates as follows:

If the user wishes to use the gas burner 42, he or she activates the ignition element 46 by actuating the operating element 48. As a result, a flame is produced in/on the gas burner 42, as a result of which heat is produced which heats up the thermocouple 22 as well, so that the thermocouple 22 generates electrical energy. In this way, the current supply to the magnetic coil 12 of the gas valve 10 starts. By virtue of the excitation of the magnetic coil 12, the movable element 14 is moved in the direction towards its active position counter to the force of the bias spring 18. As a result, the valve element 16 is also moved into its active position and opens the passage 17 of the gas supply line 44 through the gas valve 10, with the result that gas is conveyed to the gas burner 42. As a result of this, a gas flame is produced in/on the gas burner 42, the gas flame heating the gas burner 42 and therefore also the thermocouple 22 to an even greater extent. Due to the resultant greater current generation of the thermocouple 22, the current supply to the magnetic coil 12 is intensified, with the result that the movable element 14 and therefore also the valve element 16 remain in their active positions. The measuring device 24 then detects a substantially constant voltage or current level.

If, however, the ignition element 46 no longer generates a flame, although the user has not switched off the gas burner 42, the temperature in/on the gas burner 42 decreases and as a result also the current supply to the magnetic coil 12 through the thermocouple 22. As a result, the magnetic coil 12 no longer holds the movable element 14 in its active position, so that it is moved back into its initial position by the bias spring 18 and therefore the valve element 16 is likewise moved into its initial position and closes the passage 17 of the gas supply line 44. As a result of the movement of the movable element 14, an induced current is generated in the deenergized magnetic coil 12 over a short period of time, with the result that the measuring device 24 detects a peak in the voltage or current level. Due to this peak during the intended operation of the gas burner 42, the monitoring unit 26 identifies the fault state of the current supply and allows the output device 28 to output a corresponding fault message to the user in order to inform the user of the end of operation of the gas burner although it was not intended.

If the user wishes to end the operation of the gas burner 42, he or she switches off the ignition element 46 through the operating element 48. As a result, the flame in/on the gas burner 42 is extinguished and the temperature decreases, with the result that the current supply to the magnetic coil 12 through the thermocouple 22 also decreases. As a result, the magnetic coil 12 no longer holds the movable element 14 in its active position, so that it is moved back into its initial position by the bias spring 18 and therefore the valve element 16 is likewise moved into its initial position and closes the passage 17 of the gas supply line 44. Due to the movement of the movable element 14, an induced current is generated in the deenergized magnetic coil 12 over a short period of time, with the result that the measuring device 24 detects a peak in the voltage or current level.

If, however, the movable element 16 does not move, but remains in its active position, and accordingly also the valve element 16 leaves the passage 17 of the gas supply line 44 open, no induced current is generated in the magnetic coil 12. Correspondingly, the measuring device 24 will not detect a peak in the voltage or current level. As a result of this lack of peak after the intended end of operation of the gas burner 42, the monitoring unit 26 identifies the fault state of the gas valve and allows the output device 28 to output a corresponding fault message to the user in order to inform him or her of the faulty gas valve 10.

The following is a summary list of reference numerals and the corresponding structure used in the above description of the invention:

10 electromagnetic valve
12 magnetic coil
14 movable element
16 valve element
17 passage
18 bias spring
20 control circuit
22 current source
23 connecting line
24 measuring device
25 signal amplifier
26 monitoring unit
28 output device
30 control unit
40 gas burning system
42 gas burner
44 gas supply line
46 ignition element
48 operating element
50 current flow blocking device
60 method
602 measurement of the voltage level or current level
604 starting of the current supply
606 checking whether signal peak is detected
608 determination of the fault state of the current supply
610 generation of a fault message
612 determination of an absence of faults
614 ending of the current supply
616 checking whether signal peak is detected
618 determination of the fault state of the electromagnetic valve
620 determination of an absence of faults

The invention claimed is:

1. In an assembly including:
an electromagnetic valve having a magnetic coil, a valve element and a movable element coupled to the valve element, the magnetic coil, when excited, conveying the movable element in one direction for moving the valve element from an initial position into an active position;
a control circuit for the electromagnetic valve, the control circuit comprising:

a current source for selectively supplying current to the magnetic coil of the electromagnetic valve;

a measuring device for measuring at least one of a voltage level of the magnetic coil or a current level through the magnetic coil;

a monitoring unit connected to the measuring device, said monitoring unit configured to establish a switching state of the electromagnetic valve corresponding to the position of the valve element based on an intended current supply state of the current source and at least one of a current or voltage characteristic measured by said measuring device;

said monitoring unit configured to infer a movement of the movable element of the electromagnetic valve when a signal peak is detected by said measuring device; and said monitoring unit configured to determine a fault state of at least one of the current supply or of the electromagnetic valve based on the detection of a signal peak in the measured current or voltage characteristic during an intended continuing current supply to the magnetic coil.

2. The control circuit according to claim 1, which further comprises:

an output device of the control circuit;

said monitoring unit configured to transmit a signal for outputting a fault message corresponding to the determined fault state to said output device.

3. The control circuit according to claim 1, which further comprises a signal amplifier, said measuring device being connected to said monitoring unit through said signal amplifier.

4. The control circuit according to claim 1, which further comprises a safety device of the control circuit, and a control unit for actuating at least one of said current source, a connection between said current source and the magnetic coil of the electromagnetic valve or said safety device.

5. A gas burning system, comprising:

a gas burner including a gas supply line for supplying a burnable gas to said gas burner and an ignition element for generating a gas flame;

an electromagnetic gas valve for optionally opening or blocking a gas inflow through said gas supply line to said gas burner; and a control circuit according to claim 1 for actuating said electromagnetic gas valve.

6. The gas burning system according to claim 5, wherein said control circuit has a thermocouple acting as said current source, said thermocouple being positioned close enough to said gas burner to generate electrical energy from heat due to a thermoelectric effect.

7. The control circuit according to claim 1, wherein said monitoring unit is additionally configured to determine a fault state of at least one of the current supply or of the electromagnetic valve if a signal peak is not detected after a disconnection of the continuing current supply to the magnetic coil.

8. A method for monitoring a switching state of an electromagnetic valve, the method comprising:

providing a magnetic coil optionally receiving current from a current source, a valve element and a movable element coupled to the valve element, the magnetic coil, when excited, conveying the movable element in one direction to move the valve element from an initial position into an active position;

measuring at least one of a voltage level of the magnetic coil or a current level through the magnetic coil;

establishing a switching state of the electromagnetic valve corresponding to the position of the valve element based on an intended current supply state of the current source and at least one of a measured current or voltage characteristic;

inferring a movement of the movable element of the electromagnetic valve when a signal peak is detected in at least one of the measured current or voltage characteristic; and determining a fault state of at least one of the current supply or of the electromagnetic valve based on the detection of a signal peak in the measured current or voltage characteristic during an intended continuing current supply to the magnetic coil.

9. The method according to claim 8, which further comprises:

transmitting a signal for outputting a fault message corresponding to the determined fault state to an output device.

10. The method according to claim 8, which further comprises inferring a failed movement of the valve element into its initial position when a signal peak is not detected after a disconnection of the continuing current supply to the magnetic coil.

11. A method for operating a gas burning system, the method comprising:

providing a gas burner including a gas supply line for supplying a burnable gas to the gas burner and an ignition element for generating a gas flame;

using an electromagnetic gas valve for optionally opening or blocking a gas inflow through the gas supply line to the gas burner; and monitoring a switching state of the electromagnetic gas valve by carrying out the method according to claim 8.

* * * * *